(12) United States Patent
Hiroi

(10) Patent No.: US 7,294,932 B2
(45) Date of Patent: Nov. 13, 2007

(54) SEMICONDUCTOR DEVICE

(75) Inventor: Masayuki Hiroi, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 118 days.

(21) Appl. No.: 11/183,820

(22) Filed: Jul. 19, 2005

(65) Prior Publication Data

US 2006/0022224 A1    Feb. 2, 2006

(30) Foreign Application Priority Data

Jul. 28, 2004    (JP)    ............................... 2004-220073

(51) Int. Cl.
*H01L 23/48* (2006.01)
(52) U.S. Cl. ...................... 257/758; 257/759; 257/409; 257/E23.145
(58) Field of Classification Search ................. 257/758
See application file for complete search history.

(56) References Cited

U.S. PATENT DOCUMENTS

2004/0084777 A1*    5/2004    Yamanoue et al. ......... 257/758

2004/0147111 A1*    7/2004    Haung et al. ............... 438/624

FOREIGN PATENT DOCUMENTS

JP    2000-340529    12/2000

* cited by examiner

*Primary Examiner*—Tu-Tu V. Ho
(74) *Attorney, Agent, or Firm*—Young & Thompson

(57) ABSTRACT

The semiconductor device 100 includes a multilayer wiring structure formed on the semiconductor substrate. The multilayer wiring structure includes at least a first inter layer dielectric film 120 in which interconnects 124 are formed, and at least a second inter layer dielectric film 122 in which vias 126 are formed. The multilayer wiring structure includes a circuit region 110 in which the interconnects 124 and the vias 126 are formed, a seal ring region 112 formed around the circuit region 110 and in which seal rings surrounding the circuit region 110 in order to seal the circuit region 110 are formed, and a peripheral region 114 formed around the seal ring region 112. The semiconductor device 100 further includes dummy vias 136 formed of a metal material, formed in the second interlayer dielectric film 122 at the peripheral region 114.

14 Claims, 4 Drawing Sheets

SEMICONDUCTOR DEVICE

This application is based on Japanese patent application NO. 2004-220073, the content of which is incorporated hereinto by reference.

BACKGROUND OF THE INVENTION

1. Field of the Invention

The present invention relates to a semiconductor device including a multilayer wiring structure.

2. Related Art

With recent demands on faster operation speed of semiconductor devices, a great deal of investigational efforts have been made on alteration of an insulating interlayer from conventional silicon oxide film (dielectric constant K=4.3 or around) to a low-dielectric-constant insulating material layer, in order to reduce the inter-wiring capacitance. Examples of the low-dielectric-constant insulating materials include HSQ, MSQ, carbon-containing silicon oxide material and aromatic-group-containing organic resin material those having a dielectric constant of 3 or around. In pursuit of further reduction in the dielectric constant, recent developmental efforts are also made on a porous material having micro-pores introduced into the film. Use of this sort of low-dielectric-constant insulating material to the insulating interlayer makes it possible to reduce inter-wiring crosstalk, and to realize fast operations of elements.

However, the low-dielectric-constant insulating films generally have problems such as those films are relatively weak and have poor adhesiveness to other films. In addition, there is another problem that when the contents of the metal material is low, the low-dielectric-constant insulating film is over polished by CMP (Chemical Mechanical Polishing) process as the low-dielectric-constant insulating film itself is weak.

Japanese Laid-Open Patent Publication No. 2000-340529 disclosed a semiconductor device including a dummy wiring pattern formed continuously in one piece on dicing lines or within a chip in order to surround a mark part. With this structure, it is said, that the dishing can be prevented at CMP in forming the semiconductor.

As described above, although the low-dielectric-constant insulating films are relatively weak, as for the interlayer dielectric film in which interconnects or wirings are formed, the film is strengthened by the metals introduced in the film because the ratio of metals in the film becomes relatively high. Therefore, the low-dielectric-constant insulating films can be used to the interlayer dielectric film for forming interconnects therein. However, as for the interlayer dielectric film in which vias are formed, it was difficult to use the low-dielectric-constant insulating films because the ratio of metals therein is not high. Thus, there was a problem that the dielectric constant of the semiconductor device cannot be reduced even when the low-dielectric-constant insulating films are used for forming interconnects therein because the low-dielectric-constant insulating films cannot be used to the films for forming vias therein.

In addition, as the low-dielectric-constant insulating films have poor adhesiveness to other films, when heat stresses are applied to a multilayer wiring structure including the low-dielectric-constant insulating films, peeling-off of the films are easily occurred. This sort of peeling-off occurs even when the low-dielectric-constant insulating films are not used as the interlayer dielectric films.

SUMMARY OF THE INVENTION

According to the present invention, there is provided a semiconductor device, comprising: a semiconductor substrate; a multilayer wiring structure formed on the semiconductor substrate, which includes at least a first inter layer dielectric film in which interconnects are formed, and at least a second inter layer dielectric film in which vias are formed, the multilayer wiring structure including a circuit region in which the interconnects and the vias are formed, a seal ring region formed around the circuit region and in which seal rings surrounding the circuit region in order to seal the circuit region are formed, and a peripheral region formed around the seal ring region; and a dummy via formed of a metal material, formed in the second interlayer dielectric film at the peripheral region.

The semiconductor device may include a plurality of dummy vias formed at the peripheral region. Here, the dummy via(s) may be formed at regions in the peripheral region where register marks or the like are not formed. As there are formed register marks at the peripheral region, not like the seal rings, it is not possible to form the dummy vias whole regions of the peripheral region. Therefore, the dummy vias formed at the peripheral region may have island shapes. With this structure, the dummy vias can be freely placed at any regions in the peripheral region except the regions where the register marks or the like are not formed. The dummy vias may be formed such that the dimension of the cross section of the dummy via in in-plane direction is small. By this, the dummy vias can be placed with high density. The dimension of the cross section of the dummy via in in-plane direction may be preferably not larger than 1 $\mu m^2$.

By introducing the dummy via formed of a metal material in the second interlayer dielectric film, the second interlayer dielectric film can be strengthened. Furthermore, as the dummy via functions as a wedge or connection between the films, the adhesiveness of the films can be improved as well.

Generally, it is easy to introduce dummy interconnects in the first interlayer dielectric film because it is unnecessary to consider the connections of the dummy interconnects with the metal elements formed in the films above or below the first interlayer dielectric film. However, as for the dummy vias in the second interlayer dielectric film, it is impossible to place the dummy via that connects interconnects respectively formed in films placed above and below the second interlayer dielectric film and set to have different electric potentials. With this reason, it is difficult to introduce the dummy vias at the circuit region in the second interlayer dielectric film without having the size of the semiconductor device large.

However, at the peripheral region, generally provided as the margins for dicing, elements which do not contribute to the circuit operation are originally provided. Thus, it is easy to introduce dummy vias which can contribute in improving the adhesiveness of the films and strengthening the films at the peripheral region without making the circuit design complex. Therefore, peeling-off of the films can be prevented.

As for the semiconductor device of the present invention, the relative dielectric constants of the first interlayer dielectric film and the second interlayer dielectric film may not higher than 3.5.

As described above, the low-dielectric-constant insulating films generally have problems such as those films are relatively weak and have poor adhesiveness to other films. However, according to the present invention, as the dummy via is provided in the second interlayer dielectric film to reinforce the second interlayer dielectric film and improve the adhesiveness of the film with other films, the second interlayer dielectric film is strengthened enough even when it is formed of the low-dielectric-constant insulating film.

The semiconductor device of the present invention may further comprise a dummy interconnect, connected to the dummy via, formed in the first interlayer dielectric film at the peripheral region.

With this structure, the adhesiveness between the dummy via and the dummy interconnect can be improved to further improve the adhesiveness between the films. In addition, the dummy interconnect which is connected to the dummy via may have island shape. The dummy via and the dummy interconnect formed to have island shapes may be formed such that the dimension of the cross sections thereof in in-plane direction are small. Here, the dimensions of the cross sections thereof in in-plane direction may be preferably not larger than 1 µm². In another example, the dummy via may not be connected to the dummy interconnect. The semiconductor device may include a plurality of dummy vias including a first group of dummy vias which are connected to the dummy interconnects, and a second group of dummy vias which are not connected to the dummy interconnects. Even when the dummy via is not connected to the dummy interconnect, the dummy via can function as the wedge or connection and capable of improving the adhesiveness of the films.

As for the semiconductor device of the present invention, the multilayer wiring structure may include two of the first interlayer dielectric films respectively formed below and above the second interlayer dielectric film in which the dummy via is formed. The semiconductor device may further comprise at least two dummy interconnects respectively formed in the two of first interlayer dielectric films at the peripheral region such that the dummy. via is respectively connected at its lower side and upper side with the two dummy interconnects.

With this structure, the adhesiveness of the films can be further improved.

As for the semiconductor device of the present invention, the dummy via may be formed at the corner part of the peripheral region.

When the heat stress is applied to LSI chips after the LSI chips are formed by separating the plurality of elements formed on a semiconductor wafer, the LSI chips, including the parts of the semiconductor substrate, warp. When the LSI chip warps, the tensions are applied to the corner of the LSI chip. With those tensions, the peeling-off of the films from the corner tends to occur. Thus it is effectively prevent the peeling-off of the films after the LSI chips are separated, by forming the dummy via at the corner of the peripheral region especially when the adhesiveness of the films in the chip or the strength of the chip is not strong enough.

With this point, the register marks may preferably formed at the regions other than the corners (four corners) of the peripheral region. By this, the dummy vias can be introduced at the corners of the peripheral region.

As for the semiconductor device of the present invention, the metal content in the second interlayer dielectric film at the corner part of the peripheral region may be higher than the metal content in the second interlayer dielectric film at the rest of the areas other than the corner part.

By introducing the dummy vias at relatively high density at the corner of the peripheral region, the peeling-off of the films when the heat stress is applied to the multi-layered structure can be effectively prevented.

As for the semiconductor device of the present invention, the metal content in the second interlayer dielectric film at the corner part of the peripheral region may be higher than the metal content in the second interlayer dielectric film at the rest of the areas within the peripheral region other than the corner part.

By introducing the dummy vias at relatively high density at the corner of the peripheral region, the peeling-off of the films when the heat stress is applied to the multi-layered structure can be effectively prevented.

When there are multi layers of the seal rings in the semiconductor device, the dummy vias may be provided between the seal rings.

The dummy vias may be formed in a same process and at the same time with the vias in the circuit region. By this, the dummy vias can be formed at the peripheral region to reinforce the second interlayer dielectric film and improve adhesiveness of the films without increasing an additional process. In addition, the dummy interconnects may be formed in a same process and at the same time with the interconnects in the circuit region.

According to the present invention, the adhesiveness between films in the multilayer wiring structure can be improved.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
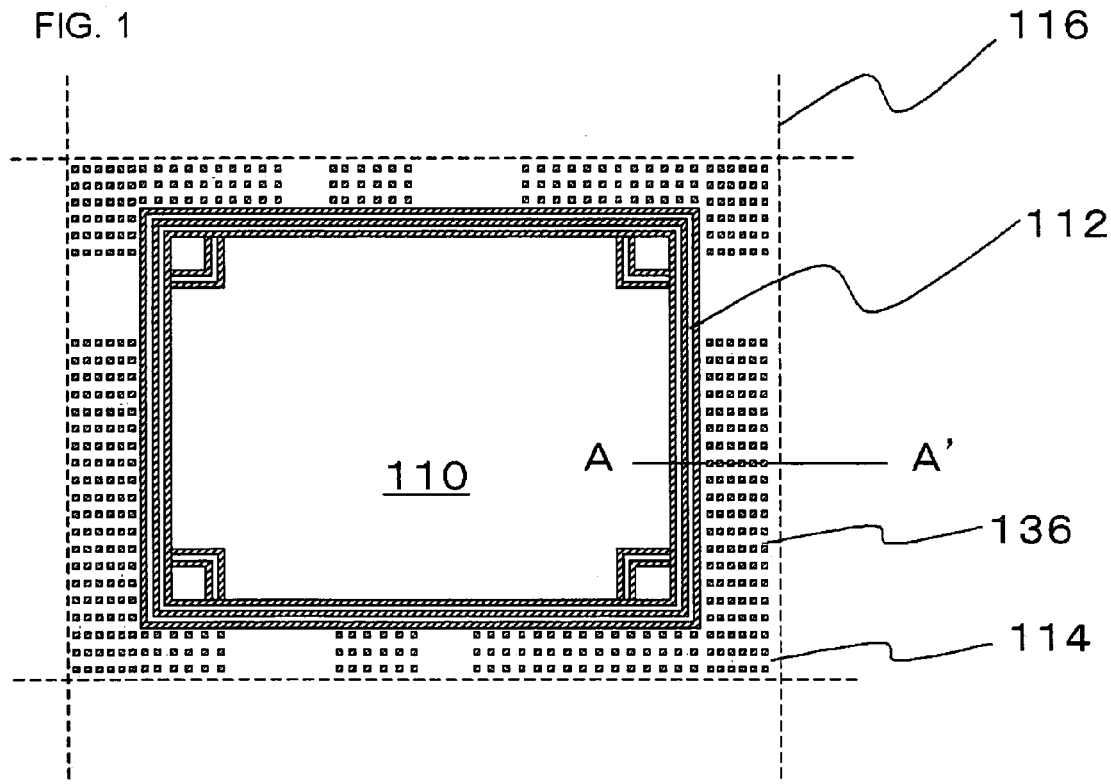
FIG. 1 is a top plan view showing the semiconductor device according to the present embodiment.

FIG. 1 is a top plan view showing the semiconductor device according to the present embodiment. Here, the top plan view of an interlayer dielectric film in which vias are formed is shown.

Here, the element forming region of one of the circuit elements formed on the semiconductor wafer is shown. The element forming region, defined or divided by the dicing lines 116, includes a circuit region 110, a seal ring region 112 formed around the circuit region 110, and a peripheral region 114 formed around the seal ring region 112. There are formed internal circuits in the circuit region 110. Although it is not described in the drawing, vias are formed in the circuit region 110. The element forming regions are separated by dicing the semiconductor wafer along the dicing lines 116 to obtain semiconductor chips.

In this embodiment, there are provided a plurality of dummy vias 136 in the peripheral region 114. The dummy vias 136 are formed at regions in the peripheral region 114 where register marks or the like are not formed. The dummy vias 136 may be formed such that the width of each of the dummy vias 136 in in-plane direction is same as that of each of the vias in the seal ring region 112 or the circuit region 110, although only the schematic view of seal rings and dummy vias is shown in FIG. 1. With this structure, the dummy vias 136 can be formed in a same process and at the same time with the vias in the circuit region 110 or the seal ring region 112. By introducing the dummy vias 136 at the peripheral region 114 of the element forming region, the peeling-off of the films can be prevented even after each of the element forming regions are separated by dicing. In addition, the interlayer dielectric films can be strengthened by introducing the dummy vias 136 in the interlayer dielectric films in which the vias are formed because the metal content rate of the interlayer dielectric films can be increased by introducing the dummy vias 136.

The dummy vias 136 may be formed on the dicing lines 116, and in which case, the dummy vias 136 are exposed at the cross section of the semiconductor chips when the semiconductor wafer is cut along the dicing lines 116 and divided into the semiconductor chips.

Figure 2:
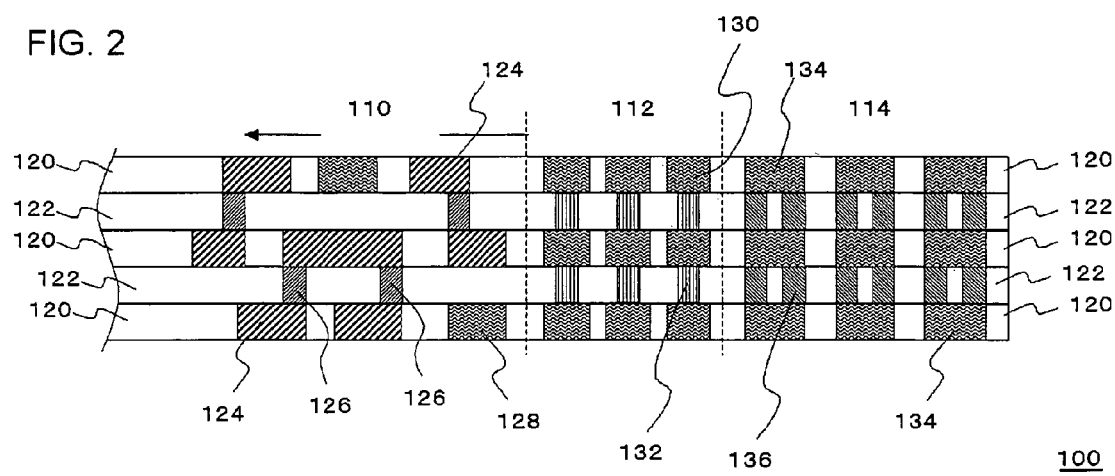
FIG. 2 is a cross sectional view of A-A' line of the semiconductor device shown in FIG. 1.

FIG. 2 is a cross sectional view of A-A' line of the semiconductor device shown in FIG. 1.

The semiconductor device 100 has a structure including a plurality of first interlayer dielectric films 120 and a plurality of second interlayer dielectric films 122, formed on a semiconductor substrate, not shown in the drawing, and in which the first interlayer dielectric films 120 and the second interlayer dielectric films 122 are interlaminated with each other. Although a etching stopper layer or a cap layer or the like may be formed between each of the first interlayer dielectric films 120 and the second interlayer dielectric films 122, it is not shown in the drawing.

At the circuit region 110, there are respectively formed interconnects 124 in the first interlayer dielectric films 120, and the vias 126 in the second interlayer dielectric films 122. Dummy interconnects 128 may be formed in the first interlayer dielectric films 120. The interconnects 124 and the dummy interconnects 128 may be formed of copper, silver, alloy thereof, and the like. The vias 126 may be formed of copper, silver, alloy thereof, and the like, as well.

In this embodiment, each of the first interlayer dielectric films 120 and the second interlayer dielectric films 122 may be formed of low dielectric films. Preferably, the dielectric constant of the low dielectric film may be not higher than 3.5. Examples of the low dielectric film can include various materials such as a polyorgano-siloxane such as SiOC, HSQ (hydrogen-silsesquioxane), MSQ (methyl-silsesquioxane), MHSQ (methyl-hydrogen-silsesquioxane), an organic material containing an aromatic family substance such as polyarylether (PAE), divinylsiloxane bis-benzocyclobutene (BCB), Silk (registered trademark), SOG (spin on glass), or FOX (flowable oxide). The low dielectric film may be formed of porous materials. By using the porous materials as the low dielectric film, the dielectric constant of the low dielectric film can be further reduced. Further, the low dielectric film may be a film obtained by irradiating electric beam or plasma beam to the porous film. By irradiating electric beam or plasma beam, the film can be strengthened in addition to lowering its relative dielectric constant. The first interlayer dielectric films 120 and the second interlayer dielectric films 122 may either be formed of same materials or different materials.

At the seal ring region 112, there are respectively formed seal ring interconnects 130 in the first interlayer dielectric films 120 and seal ring vias 132 in the second interlayer dielectric films 122. The circuit elements formed at the circuit region 110 can be protected by the seal ring interconnects 130 and the seal ring vias 132 from being corroded by water or impurities that exist outside.

At the peripheral region 114, there are respectively provided dummy interconnects 134 in the first interlayer dielectric films 120, and the dummy vias 136 in the second interlayer dielectric films 122.

By introducing the dummy interconnects 128 (at the circuit region 110) and the dummy interconnects 134 (at the peripheral region 114) in the first interlayer dielectric films 120, over polishing of the first interlayer dielectric films 120 which occurs when the metal densities are low during a process of chemical mechanical polishing (CMP) can be prevented.

In addition, the second interlayer dielectric films 122 are reinforced and strengthened by the dummy vias 136 formed in the second interlayer dielectric films 122. Further, the dummy vias 136 function as wedges or connections capable of improving the adhesiveness between the films so that the peeling of the films at the edges of each of, the element forming regions can be prevented.

The dummy interconnects 134 and the dummy vias 136 may be formed by damascene process at the same time with the interconnects and the vias at the circuit region 110, respectively.

Figure 3:
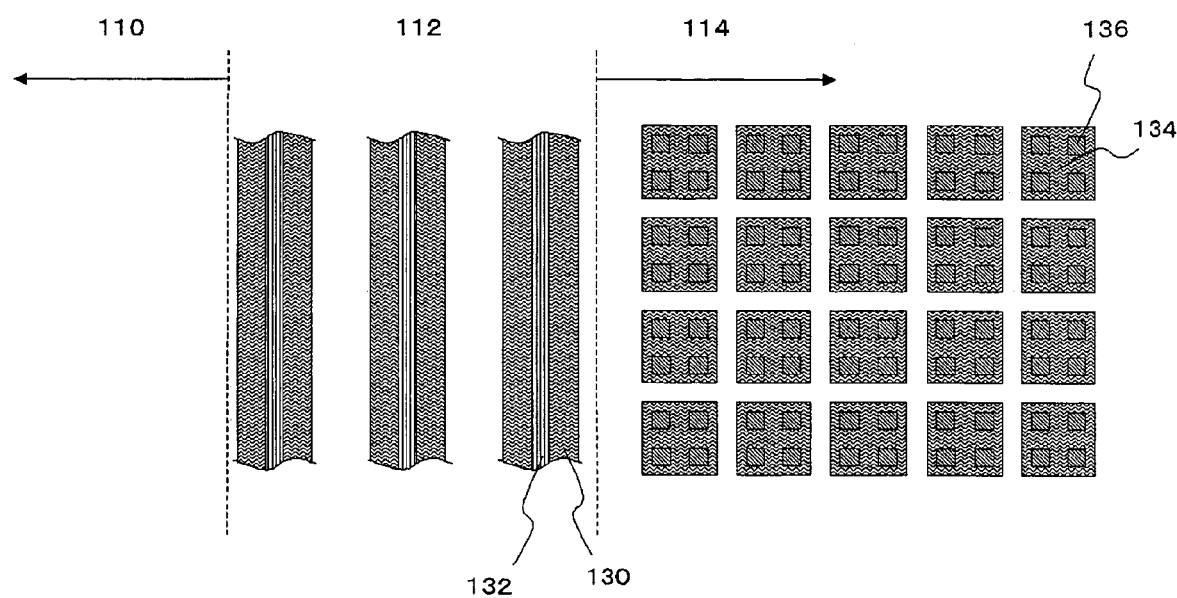
FIG. 3 is a top plan view showing an example of the configurations of the vias and the interconnects formed at the seal ring region and the peripheral region.

FIG. 3 is a top plan view showing an example of the configurations of the vias and the interconnects formed at the seal ring region and the peripheral region. The vias and the interconnects formed at the circuit region 110 are not shown in the drawing.

The seal ring interconnects 130 and the seal ring vias 132 formed at the seal ring region 112 are formed in line shapes continuously surrounding the circuit region 110. With this structure, the circuit elements formed at the circuit region 110 can be protected from being corroded by water or impurities that exist outside.

The dummy interconnects 134 and the dummy vias 136 formed at the peripheral region 114 are formed in island shapes. As there are formed alignment marks and the like at the peripheral region 114, the dummy interconnects 134 and the dummy vias 136 are formed at the places where the alignment marks and the like are not formed at the peripheral region 114. Here, the dimension of the cross section of the dummy interconnects 134 and the dummy vias 136 in in-plane direction may be not larger than 1 $\mu m^2$. With this dimension, the dummy interconnects 134 and the dummy vias 136 can be placed with high density.

Figure 4A:
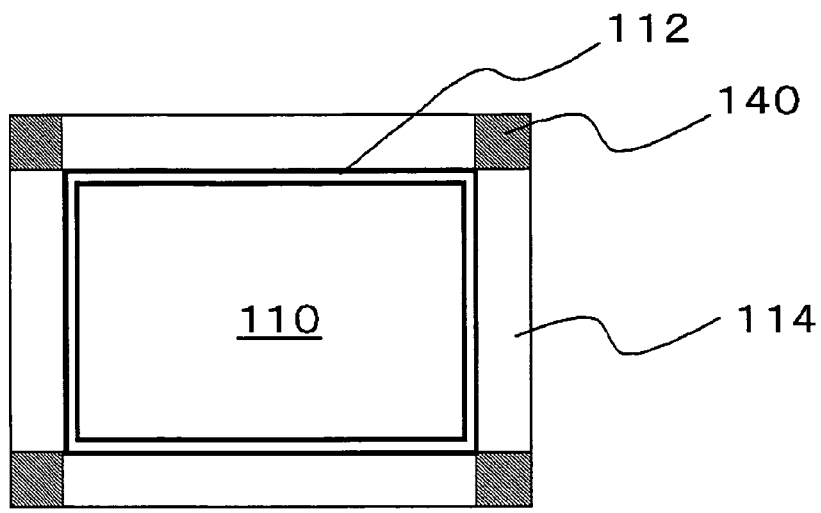
FIGS. 4A and 4B are top schematic views each showing one of the element forming region of the semiconductor device.
Figure 4B:
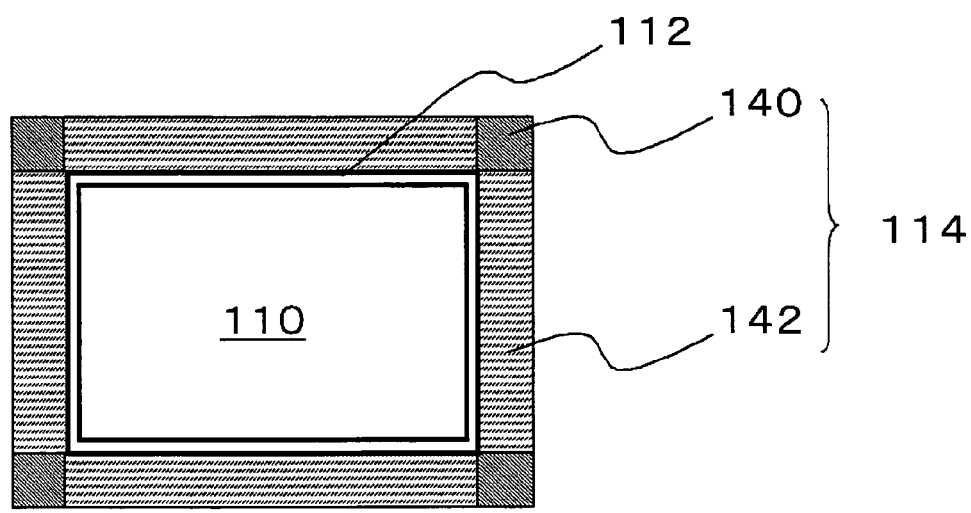

FIGS. 4A and 4B are top schematic views each showing one of the element forming region of the semiconductor device 100.

As shown in FIG. 4A, the metal content rate of the corner region 140 of the peripheral region 114 may preferably be higher than that of the other regions in the second interlayer dielectric films 122. Here, "the other regions" may be, for example, the circuit region 110 or the seal ring region 112. Thus, the dummy vias 136 are preferably placed at the corner region 140 of the peripheral region 114 with high density. By introducing the dummy vias 136 with relatively high density at the corner region 140 of the peripheral region 114, the peeling off of the films when heat stress is applied to the semiconductor device 100 can be effectively prevented.

As shown in FIG. 4B, the metal content rate of the corner region 140 may preferably be higher than that of the other region 142 of the peripheral region 114 in the second interlayer dielectric films 122. Thus, the dummy vias 136 are preferably placed at the corner region 140 of the peripheral region 114 with high density. By introducing the dummy vias 136 with relatively high density at the corner region 140 of the peripheral region 114, the peeling off of the layers when heat stress is applied to the semiconductor device 100 can be effectively prevented.

Figure 5A:
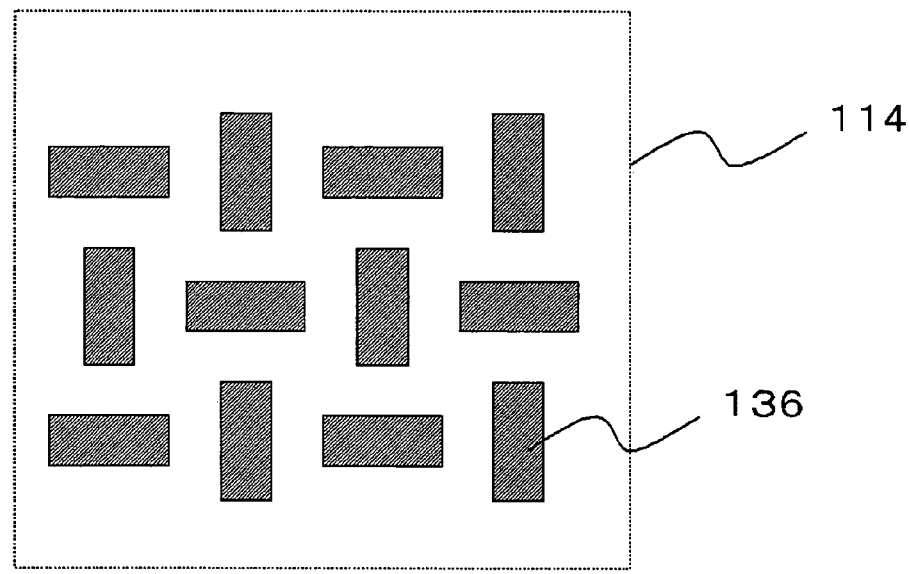
FIGS. 5A and 5B are top schematic views each showing the arrangement pattern of the dummy vias in the peripheral region.
Figure 5B:
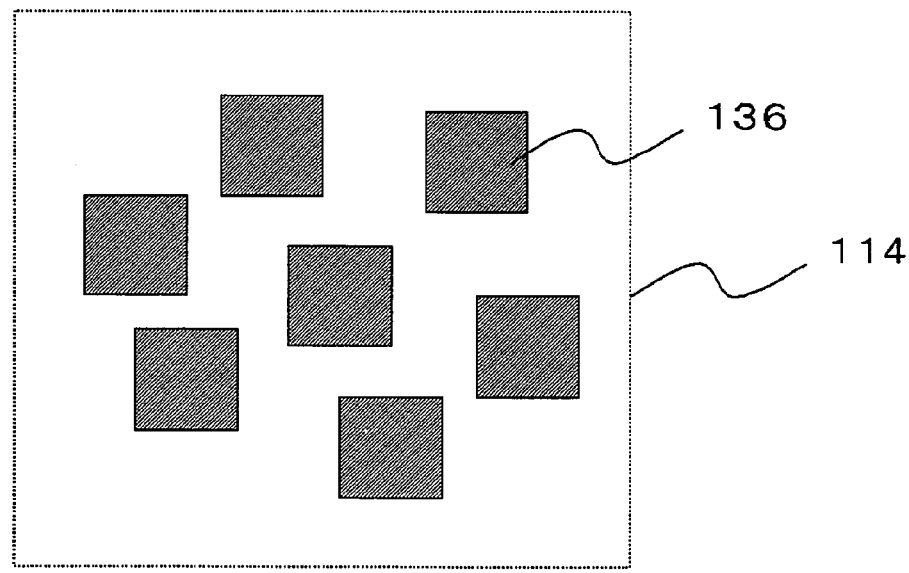

FIGS. 5A and 5B are top schematic views each showing another example of arrangement pattern of the dummy vias 136 in the peripheral region 114.

As shown in FIG. 5A, the dummy vias 136 may be formed in rectangular shape having long sides and short sides. In this case, the dummy vias 136 are placed such that the long sides of the rectangular of the adjacent dummy vias 136 extend in different directions. In other words, while the long sides of the rectangular of one of the dummy vias 136 extend in a first direction, the long side of the rectangular of adjacent another one of the dummy vias 136 extend in a second direction which is substantially perpendicular to the first direction. The dummy vias 136 may be placed at random as shown in FIG. 5B.

With these structure, the stress applied to the second interlayer dielectric films 122 can be dispersed so that the second interlayer dielectric film 122 can be strengthened.

As described above, according to the semiconductor device 100 of this embodiment, as the dummy vias are provided at the peripheral region of each of the element forming regions, the adhesiveness between the films can be improved. In addition, the interlayer dielectric films in which the dummy vias are provided can be strengthened. Therefore, the low dielectric constant films can be used as the interlayer dielectric films in which vias are formed. By this, the dielectric constant of the total interlayer dielectric films of the semiconductor device can be reduced.

EXAMPLE

A semiconductor chip, size of which is 20 mm×20 mm, having a multilayer wiring structure of nine layers and copper interconnects in which low-dielectric-constant insulating films (SiOC) having the relative dielectric constant of 2.3 are used as the interlayer dielectric film was obtained. In the semiconductor chip, the dummy vias were provided at the peripheral region thereof where the content rate of metals in the region was 11%. At the same time, a reference semiconductor chip having the same structure as described above but no dummy vias were provided was obtained.

To each of the semiconductor chips, heat cycles from −60 to 150 degree centigrade were applied for a thousand (1,000) times. As a result, almost no peeling-off of the films was seen on the semiconductor chip with the dummy vias. On the contrary, as for the reference semiconductor chip without the dummy vias, peeling-off of the films was seen to the extent of no less than 80%.

While the preferred embodiment and the example of the present invention have been described above, it should be understood that the configuration of the present invention is not limited to the above-described embodiments. For example, the present invention may include the following aspects.

Although it is described in the embodiment that the dummy interconnects 134 are also provided at the peripheral region 114, the dummy interconnects 134 may not be provided and only the dummy vias 136 are provided at the peripheral region 114. Even with this structure, the second interlayer dielectric film 122 in which the dummy vias 136 are provided can be strengthened and adhesiveness thereof with other films can be improved.

Furthermore, the dummy vias can be introduced between the seal rings formed at the seal ring region 112. With this structure, the second interlayer dielectric film 122 in which the dummy vias 136 are provided can be more strengthened and adhesiveness thereof with other films can be more improved. Furthermore, the dummy vias can be introduced inside the seal rings, between the seal ring region 112 and the circuit region 110. With this structure, same merits can be obtained.

It is apparent that the present invention is not limited to the above embodiment, that may be modified and changed without departing from the scope and spirit of the invention.

What is claimed is:

1. A semiconductor device, comprising:
    a semiconductor substrate;
    a multilayer wiring structure formed on said semiconductor substrate, said multilayer wiring structure including at least a first inter layer dielectric film having interconnects formed therein, and at least a second inter layer dielectric film having vias formed therein, said multilayer wiring structure including a circuit region in which said interconnects and said vias are formed, a seal ring region formed around said circuit region and in which seal rings surrounding said circuit region are formed, and a peripheral region formed around said seal ring region; and
    a plurality of dummy vias formed in said second interlayer dielectric film at said peripheral region, said dummy vias being formed of a metal material; and
    a dummy interconnect formed in said first interlayer dielectric film at said peripheral region, wherein said dummy interconnect being connected to said plurality of dummy vias.

2. The semiconductor device as set forth in claim 1, wherein relative dielectric constants of said first interlayer dielectric film and said second interlayer dielectric film are not higher than 3.5.

3. The semiconductor device as set forth in claim 1, wherein said multilayer wiring structure includes two said first interlayer dielectric films respectively formed below and above said second interlayer dielectric film having said dummy via formed therein, wherein said semiconductor device further comprising two dummy interconnects respectively formed in each of said two first interlayer dielectric films at said peripheral region such that said dummy via is respectively connected at its lower side and upper side with said two dummy interconnects.

4. The semiconductor device as set forth in claim 1, wherein said dummy via is formed at the corner part of said peripheral region.

5. The semiconductor device as set forth in claim 4, wherein the metal content rate in said second interlayer dielectric film at said corner part of said peripheral region is higher than the metal content rate in said second interlayer dielectric film at the rest of the areas other than said corner part.

6. The semiconductor device as set forth in claim 4, wherein the metal content rate in said second interlayer dielectric film at said corner part of said peripheral region is higher than the metal content rate in said second interlayer dielectric film at the rest of the areas within said peripheral region other than said corner part.

7. The semiconductor device as set forth in claim 1, wherein the dimension of the cross section of said dummy via in in-plane direction is not larger than 1 μm².

8. The semiconductor device as set forth in claim 2, further comprising a dummy interconnect, formed in said first interlayer dielectric film at said peripheral region, said dummy interconnect being connected to said dummy via.

9. The semiconductor device as set forth in claim 2, wherein said multilayer wiring structure includes two said first interlayer dielectric films respectively formed below and above said second interlayer dielectric film having said dummy via formed therein, wherein said semiconductor device further comprising two dummy interconnects respectively formed in each of said two first interlayer dielectric films at said peripheral region such that said dummy via is respectively connected at its lower side and upper side with said two dummy interconnects.

10. The semiconductor device as set forth in claim 2, wherein said dummy via is formed at the corner part of said peripheral region.

11. The semiconductor device as set forth in claim 10, wherein the metal content rate in said second interlayer dielectric film at said corner part of said peripheral region is higher than the metal content rate in said second interlayer dielectric film at the rest of the areas other than said corner part.

12. The semiconductor device as set forth in claim 10, wherein the metal content rate in said second interlayer dielectric film at said corner part of said peripheral region is higher than the metal content rate in said second interlayer dielectric film at the rest of the areas within said peripheral region other than said corner part.

13. The semiconductor device as set forth in claim 2, wherein the dimension of the cross section of said dummy via in in-plane direction is not larger than 1 μm².

14. The semiconductor device as set forth in claim 5, wherein the dimension of the cross section of said dummy via in in-plane direction is not larger than 1 μm².

* * * * *